United States Patent
Jung

(10) Patent No.: US 8,796,100 B2
(45) Date of Patent: Aug. 5, 2014

(54) METHODS OF MANUFACTURING LATERAL DIFFUSED MOS DEVICES WITH LAYOUT CONTROLLED BODY CURVATURE AND RELATED DEVICES

(75) Inventor: Jeesung Jung, Campbell, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 378 days.

(21) Appl. No.: 13/205,491

(22) Filed: Aug. 8, 2011

(65) Prior Publication Data

US 2013/0040432 A1    Feb. 14, 2013

(51) Int. Cl.
H01L 21/331 (2006.01)
H01L 31/113 (2006.01)
H01L 29/00 (2006.01)

(52) U.S. Cl.
USPC ........... 438/316; 438/325; 438/327; 438/335; 257/341; 257/343; 257/556

(58) Field of Classification Search
USPC ................. 438/234–236, 316, 325, 327, 335; 257/341, 343, 365, 556, 557, 575
See application file for complete search history.

(56) References Cited

U.S. PATENT DOCUMENTS

| | | | |
|---|---|---|---|
| 5,242,841 A * | 9/1993 | Smayling et al. | 438/275 |
| 6,207,484 B1 * | 3/2001 | Kim et al. | 438/209 |
| 6,252,278 B1 | 6/2001 | Hsing | |
| 6,380,566 B1 * | 4/2002 | Matsudai et al. | 257/175 |
| 6,518,138 B2 | 2/2003 | Hsing | |
| 6,680,515 B1 | 1/2004 | Hsing | |
| 6,825,531 B1 * | 11/2004 | Mallikarjunaswamy | 257/343 |
| 7,087,973 B2 * | 8/2006 | Mallikarjunaswamy et al. | 257/493 |
| 2006/0220168 A1 | 10/2006 | Hsing | |
| 2009/0090981 A1 * | 4/2009 | Natsuaki | 257/408 |
| 2010/0301414 A1 | 12/2010 | Yoo | |

OTHER PUBLICATIONS

U.S. Appl. No. 13/092,699 to Inventor Jeesung Jung, filed Apr. 22, 2011.
U.S. Appl. No. 12/980,143 to Inventor Tiesheng Li, filed Dec. 28, 2011.
U.S. Appl. No. 13/072,569 to Inventor Jeesung Jung, filed Mar. 25, 2011.

* cited by examiner

*Primary Examiner* — Hsien Ming Lee

(74) *Attorney, Agent, or Firm* — Perkins Coie LLP

(57) ABSTRACT

The present invention discloses a method of manufacturing an N-type LDMOS device. The method comprises forming a gate above the semiconductor substrate; forming a body, comprising forming a Pwell apart from the gate and forming a Pbase partly in the Pwell, wherein the Pbase is wider and shallower than the Pwell; and forming an N-type source and a drain contact region. Wherein the body curvature of the LDMOS device is controlled by adjusting the layout width of the Pwell.

18 Claims, 11 Drawing Sheets

METHODS OF MANUFACTURING LATERAL DIFFUSED MOS DEVICES WITH LAYOUT CONTROLLED BODY CURVATURE AND RELATED DEVICES

TECHNICAL FIELD

The present invention generally relates to semiconductor devices, and more particularly but not exclusively relates to Laterally Diffused Metal Oxide Semiconductor (LDMOS) devices.

BACKGROUND

LDMOS plays an important role in high voltage applications, for example, power supplies, power management, telecommunications, automotive electronics, and industrial controls. For a LDMOS device, breakdown voltage is critical to its performance. One main objective of the design of a LDMOS device is to develop a high breakdown voltage while not compromising other parameters. There are various factors that affect the breakdown voltage.

Moreover, in some applications, LDMOS devices with different break down voltages are needed, and are required to be integrated in the same semiconductor substrate.

In order to address the above problems, additional mask(s) or complex procedures are usually required in the present solutions which greatly add the cost.

As a result, an improved method is needed to address the above deficiencies with simple solution and low cost.

SUMMARY

In one embodiment of the present invention, a method of manufacturing a LDMOS device in a semiconductor substrate comprises: forming a gate above the semiconductor substrate; forming a body, comprising forming a Pwell and forming a Pbase partly in the Pwell, wherein the Pbase is wider and shallower than the Pwell; and forming a source and a drain contact region. Wherein the body curvature of the LDMOS device is controlled by adjusting the layout width of the Pwell.

BRIEF DESCRIPTION OF THE DRAWINGS

Non-limiting and non-exhaustive embodiments are described with reference to the following drawings. The drawings are only for illustration purpose. The drawings may only show part of the devices of the embodiments. These drawings are not necessarily drawn to scale. The relative sizes of elements illustrated by the drawings may differ from the relative size depicted.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

In the description of the present application, A having a "positive relationship" with B means that when B increases, A increases accordingly, or when B decreases, A also decreases, and vice versa. A having a "negative relationship" with B means that A and B are in trade-off relationship, and when B increases, A decreases accordingly or when B decreases, A increases accordingly.

Figure 1:
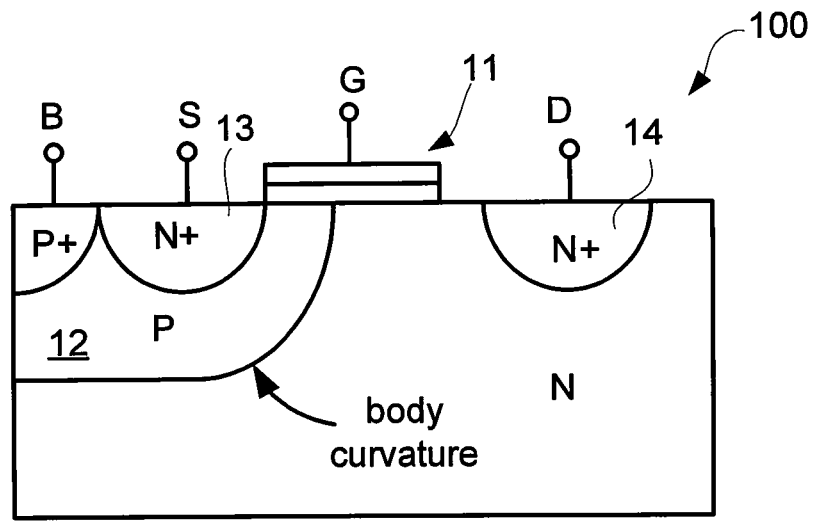
FIG. 1 shows a typical LDMOS device as a prior art.

A semiconductor device with a LDMOS device 100 is shown in FIG. 1 to illustrate a first phenomenon. And a second phenomenon will be illustrated with reference to FIG. 2.

The LDMOS device 100 comprises a gate terminal G coupled to a gate region 11, a body terminal B coupled to a body region 12, a source terminal S coupled to a source region 13, and a drain terminal D coupled to a drain contact region 14. Typically, in some embodiments, the body terminal B and the source terminal S are coupled together by a metal layer. The first phenomenon is that: when the LDMOS device 100 is biased and activated, the highest electric field sometimes occurs at the body curvature shown in FIG. 1 due to the electric field crowding there. The smoother the body curvature is, the higher the breakdown voltage will be achieved.

Figure 2:
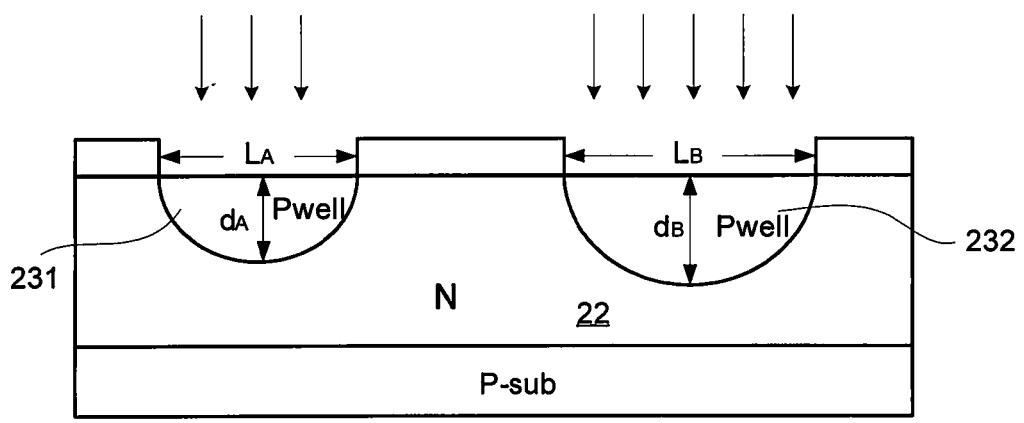
FIG. 2 shows a phenomenon during the semiconductor processing of well formation that the width of the implantation opening affects the implantation depth.

A second phenomenon with reference to FIG. 2 will also be illustrated. During the semiconductor processing of well formation, under certain implantation conditions, such as given the certain ion-implantation dose, energy, tilt and thermal annealing conditions, the final depth of the implanted well has a positive relationship with the layout width of the well. That is, during the formation of the well, when the mask opening increases laterally, the implantation depth increases accordingly.

Referring to FIG. 2, two Pwells 231 and 232 are formed under the same implantation conditions in an Nwell 22. Pwell 231 is formed with a mask opening width of $L_A$ and Pwell 232 is formed with a mask opening width of $L_B$ wherein $L_A$ is narrower than $L_B$. Accordingly, the implantation depth $d_A$ is shallower than the depth $d_B$. With this characteristic, the desired body curvature can be controlled by adjusting the layout width of the Pwell region.

FIGS. 3A-3F illustrate a method of manufacturing a LDMOS device 300 (shown in FIG. 3F) according to an embodiment of the present invention. The body curvature (shown in FIG. 3F) of the N-type LDMOS device 300 is controlled by adjusting the layout width of a Pwell 321, according to an embodiment of the present invention.

Figure 3A:
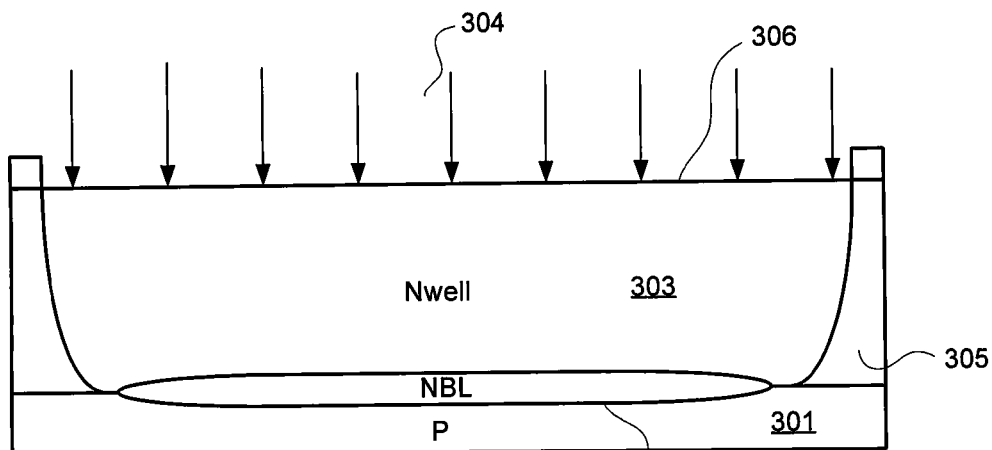
FIGS. 3A-3F illustrate a method of manufacturing an N-type LDMOS device with body curvature controlled by adjusting the layout width of a Pwell according to an embodiment of the present invention.

Firstly, referring to FIG. 3A, an Nwell 303 is formed in a semiconductor substrate from a top surface 306. In one embodiment, the Nwell 303 is formed by implanting N-type dopants into the semiconductor substrate through the mask opening 304 and then performing a thermal annealing process. The semiconductor substrate comprises a P-type substrate 301, an N-type buried layer (NBL) 302 under the LDMOS region and an epitaxial layer 305. The term "semiconductor substrate" can refer to other material(s), and/or with other configuration(s) and/or integrates component(s), device(s) or system(s). The NBL layer 302 is preferably and optionally manufactured, for example to reduce the parasitic bipolar transistor. In some embodiments, the term "semiconductor substrate" also refers to the combination of P-type substrate 301, NBL layer 302, epitaxial layer 305 and Nwell 303.

Figure 3B:
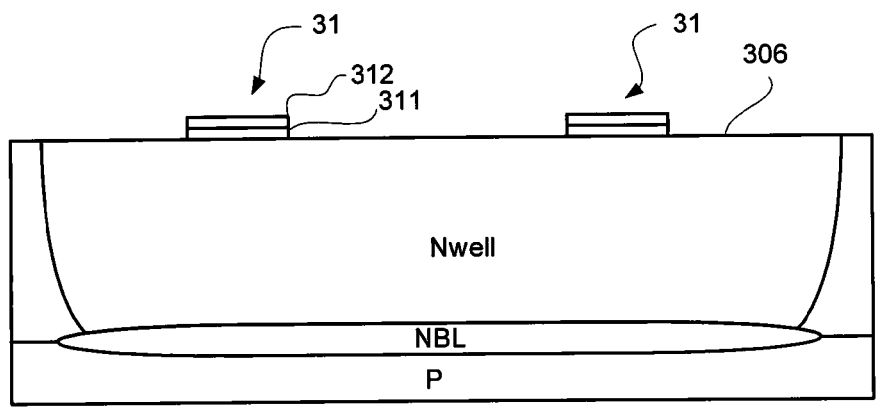

In FIG. 3B, a gate 31 is formed above the semiconductor substrate 30 from the top surface 306. In one embodiment, forming the gate comprises forming an oxide layer 311 and forming a polysilicon layer 312 by adopting any appropriate methods.

Figure 3C:
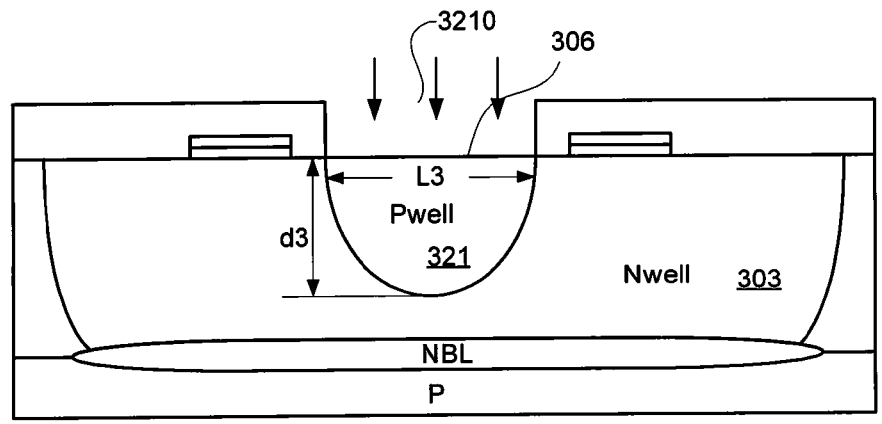
Figure 3D:
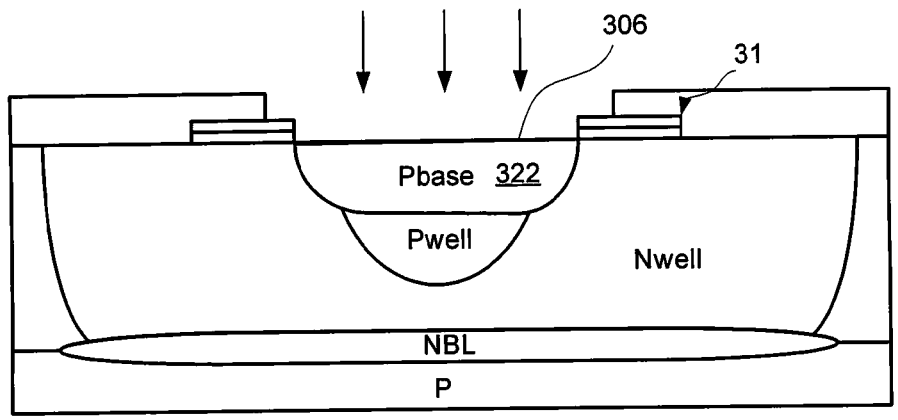
Figure 3E:
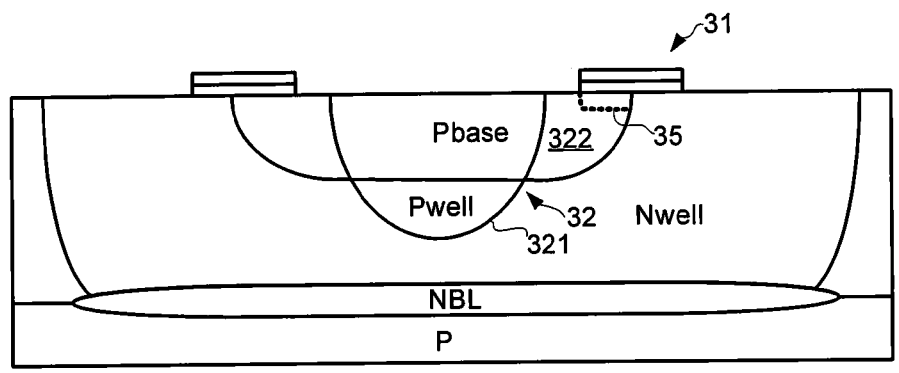

In FIGS. 3C-3E, a body 32 is manufactured comprising forming a Pwell 321 and forming a Pbase 322, wherein the body curvature is controlled by adjusting the layout width of Pwell 321.

Firstly, in FIG. 3C, a Pwell 321 is formed in the Nwell 303. P-type dopants are ion-implanted from the top surface 306 through the layout opening 3210. A thermal annealing step is optionally performed after the ion-implantation step. The layout width L3 has a positive relationship with the depth d3, in accordance with the phenomenon referring to FIG. 2.

Then in FIG. 3D, a Pbase 322 is formed self-aligned to the edge of the gate 31 from the top surface 306.

In FIG. 3E, a thermal annealing step is performed to side diffuse Pbase 322 under gate 31 and forms a channel region 35. Pbase 322 is partly overlapped in Pwell 321. And Pbase 322 is wider and shallower than Pwell 321.

In some other embodiments, forming the Pbase can adopt any suitable method, for example, the thermal diffusion method after forming the Pwell, the double diffusion method of forming the Pbase and the Pwell in meantime.

Figure 3F:
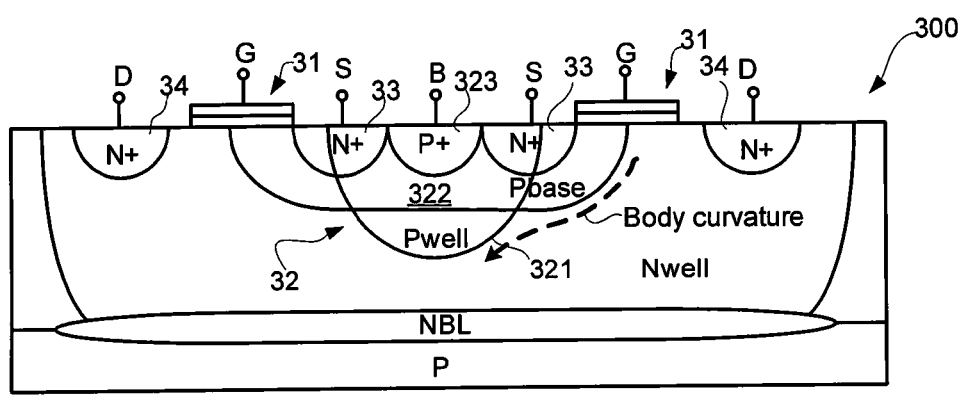
Figure 4A:
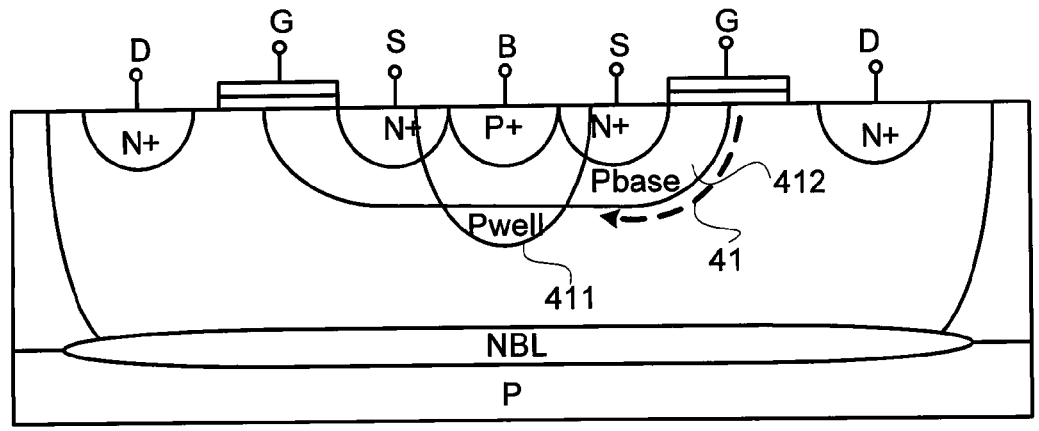
FIG. 4A illustrates a LDMOS device with a smaller Pwell width and FIG. 4B illustrates a LDMOS device with a larger Pwell width according to an embodiment of the present invention.
Figure 4B:
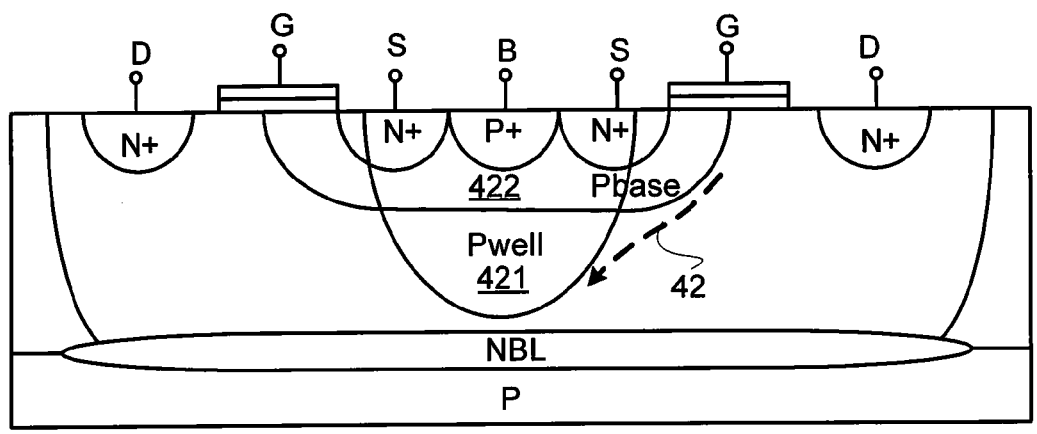

The body curvature is defined by the outlines of Pwell 321 and Pbase 322, as will be illustrated in FIG. 4A and FIG. 4B. First referring to FIG. 4A, when Pwell 411 as shown has a narrower and shallower shape, the electric field crowding occurs at the turning point of Pbase 412, the body curvature 41 approximates the curvature of the Pbase 412 and the body curvature 41 is large. Then referring to FIG. 4B, when the Pwell 421 has a broader and deeper shape, the body curvature 42 is reduced decided by the combined outlines of Pwell 421 and Pbase 422 and the electric field is relieved. Referring to FIG. 3F, with a fixed Pbase 322, the deeper the Pwell 321 is, the wider the Pwell 321 is and the smaller body curvature and higher breakdown voltage are. Thus, the body curvature can be controlled by adjusting the layout width of Pwell 321 with a negative relationship and the breakdown voltage can also be controlled by adjusting the layout width of Pwell 321 with a positive relationship up to a certain Pwell width.

Figure 5A:
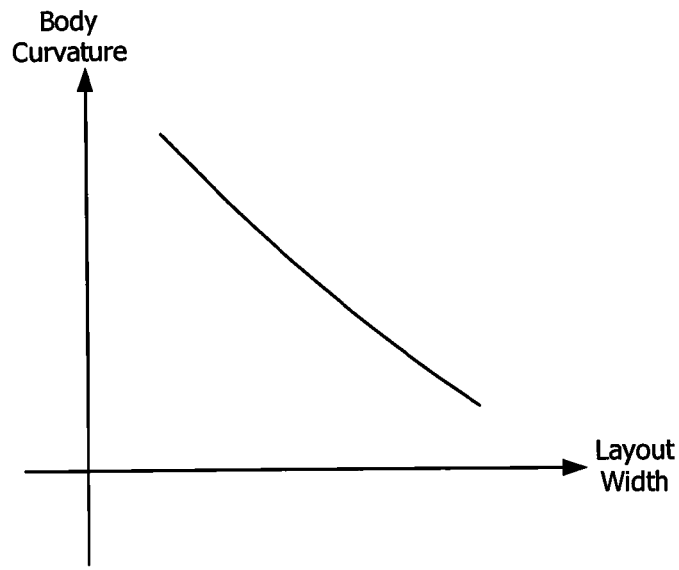
FIG. 5A shows a chart schematically illustrating the relationship between the Pwell layout width and the body curvature according to an embodiment of the present invention.
Figure 5B:
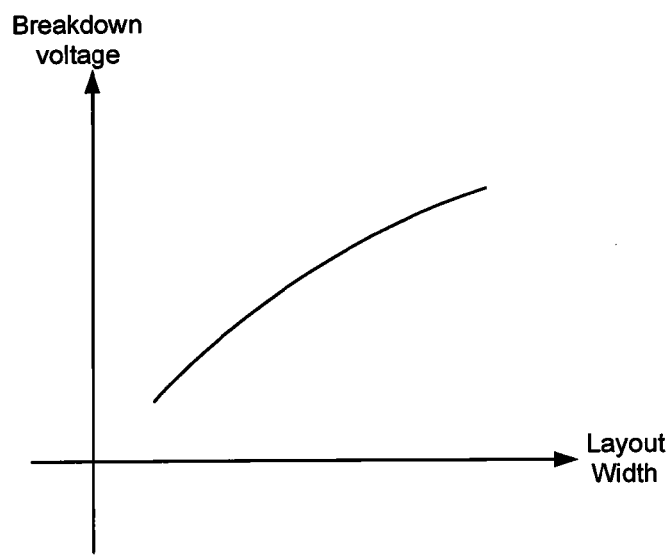
FIG. 5B shows a chart schematically illustrating the relationship between the Pwell layout width and the breakdown voltage up to a certain Pwell width according to an embodiment of the present invention.

Referring to FIG. 5A, a negative relationship between the layout width of the Pwell and the body curvature is schematically illustrated It can be seen that when the layout width increases, the body curvature decreases, and thus the layout width can be adjusted according to the desired body curvature. And in FIG. 5B, a positive relationship between the layout width of the Pwell and the breakdown voltage is also schematically shown for a certain range of the layout width. "For a certain range" refers to the conditions such as when the Pwell is too deep, the highest electric field may happen at the Pwell itself which will not conform to the relationship as illustrated in FIG. 5B. Within the certain range of the layout width, and with other parameters fixed for the LDMOS, when the layout width increases, the breakdown voltage increases accordingly, thus the layout width can be adjusted according to the desired breakdown voltage. If a smaller body curvature and higher breakdown voltage is desired, the layout width of Pwell can be adjusted to be larger.

In one embodiment, the gate is formed after forming the Pwell and before forming the Pbase.

And in another embodiment, the gate is formed after forming the Pwell and the Pbase. And Pbase side diffusion is not necessary.

After forming body region 32 and channel region 35, in FIG. 3F, an N+ source 33 and an N+ drain contact region 34 are formed in the same step(s) wherein source 33 is adjacent to body 32 and is self-aligned to one side of gate 35 and drain contact region 34 is at another side of gate 35. Further steps such as P+ body contact region 323, electrical interconnections are formed to finalize LDMOS device 300.

FIGS. 6A-6D illustrate several steps of another method of manufacturing a LDMOS device according to an embodiment of the present invention. In this method, an Nwell 62 is formed as a counter-part of a Pwell 61 of the body. Nwell 62 is formed after forming Pwell 61 and an oxide layer on Pwell 61 serves as the blocking mask for forming Nwell 62.

Figure 6A:
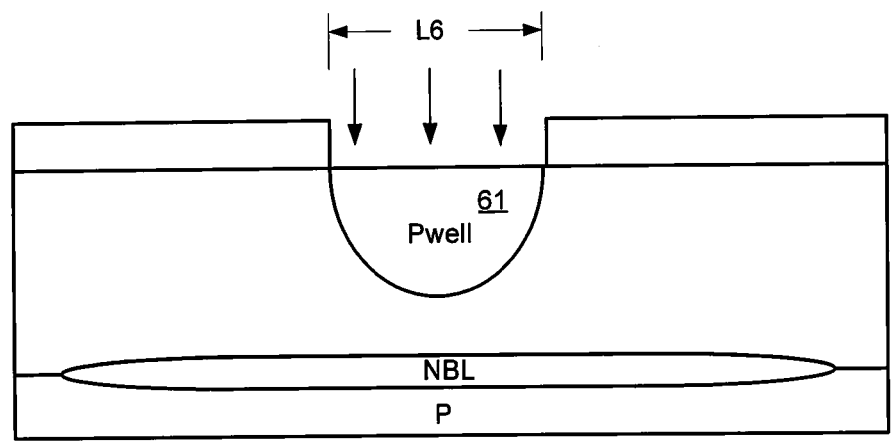
FIGS. 6A-6D illustrate another method of manufacturing a LDMOS device according to an embodiment of the present invention.
Figure 6B:
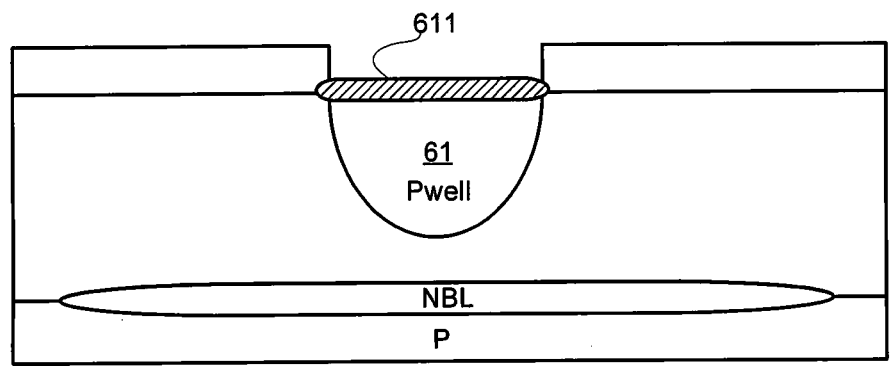
Figure 6C:
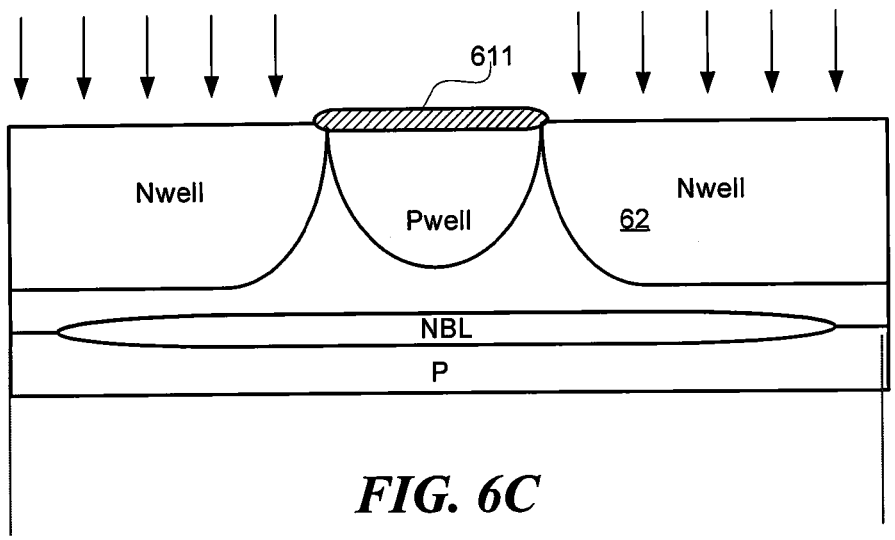
Figure 6D:
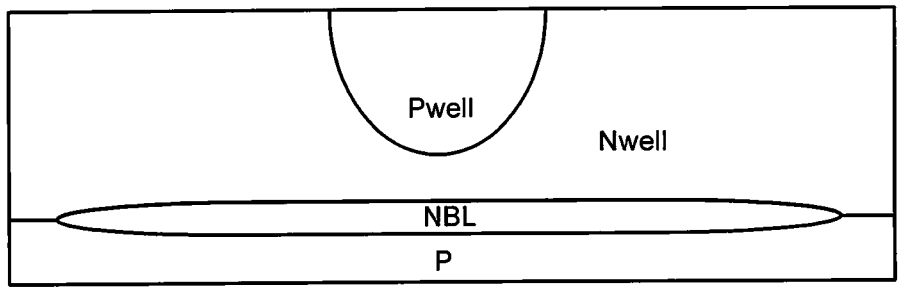

In FIG. 6A, a Pwell 61 of the body of a LDMOS device is manufactured in a semiconductor substrate. The desired body curvature has a negative relationship with the layout width L6. Then in FIG. 6B, an oxide layer 611 is formed above the Pwell 61 and self-aligned to the Pwell 61. In FIG. 6C, an Nwell 62 is formed with ion-implantation process using the oxide layer 611 as a blocking mask. And in FIG. 6D, a thermal annealing step is performed to side diffuse the Nwell 62 under the Pwell.

After that, gate, Pbase, source and drain contact regions are formed thereafter. These steps can be the same to the corresponding steps as illustrated above with reference to FIGS. 3A-3F.

FIGS. 7A-7G Illustrate another method of controlling the body curvature, according to yet another embodiment of the present invention. In this method, the body curvature is controlled by adjusting the layout space width L7 of an Nwell 703 for an N-type LDMOS.

Figure 7A:
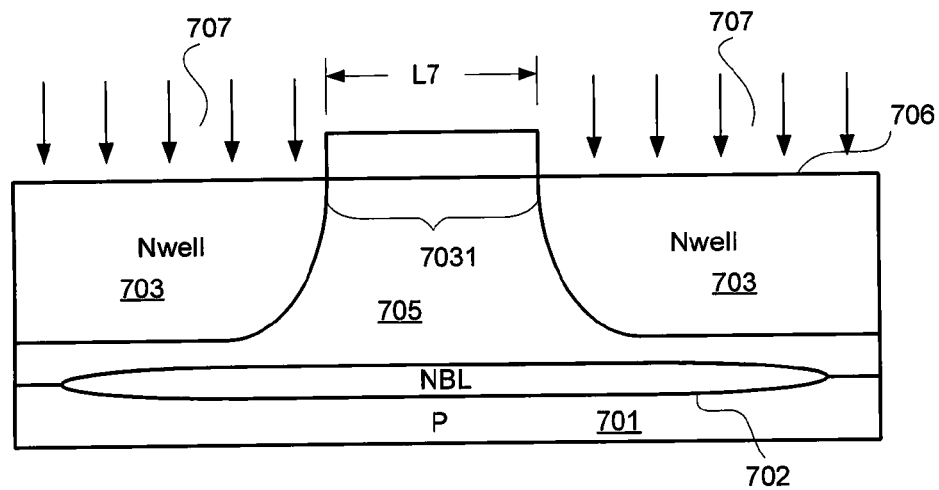
FIGS. 7A-7G illustrate yet another method of manufacturing an N-type LDMOS device where the body curvature is controlled by adjusting the layout space width of an Nwell according to an embodiment of the present invention.

In FIG. 7A, an Nwell 703 is formed in a semiconductor substrate from a top surface 706. N-type dopants are implanted from the Nwell window 707 defined by a mask. Though Nwell 703 is shown in separate part from this sectional view, Nwell 703 can be an integral region. The semiconductor substrate comprises a P-type substrate 701, an NBL layer 702 under the LDMOS region and an epitaxial layer 705. The term "semiconductor substrate" can also refer to other material(s), and/or with other configuration(s) and/or integrates other component(s), device(s) and system(s). Nwell 703 is formed with a layout space 7031 where Nwell is not formed such that the Nwell 703 has a "hollow" for manufacturing the other region(s). The layout space 7031 has a layout space width L7.

Figure 7B:
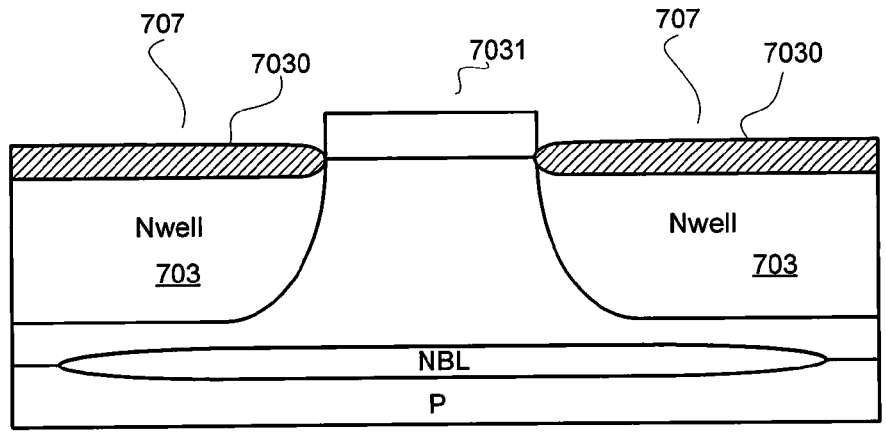

In FIG. 7B, an Nwell oxide 7030 is formed on the Nwell 703 from the window 707. An Nwell oxidation process is taken out and an Nwell oxide 7030 is grown in the Nwell window 707 to be self-aligned to the edge of Nwell 703, whereas the layout space 7031 of Nwell is not covered with oxide.

Figure 7C:
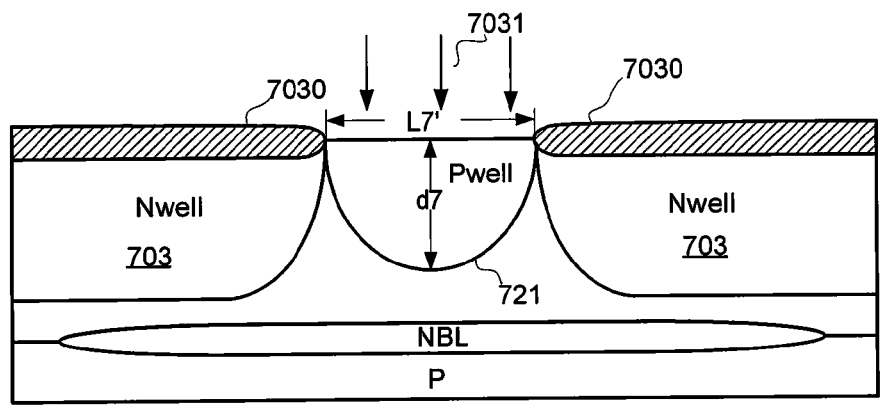

In FIG. 7C, a Pwell 721 is formed in the semiconductor substrate from the top surface 706, using Nwell oxide 7030 serving as the blocking mask. P-type substances are implanted into layout space 7031 to form Pwell 721. The lateral width L7' of Pwell 721 is determined by layout space 7031 of the Nwell. Thus, depth d7 of Pwell 72 can be adjusted by layout space 7031 of Nwell 703, referring to the phenomenon illustrated in FIG. 2.

Figure 7D:
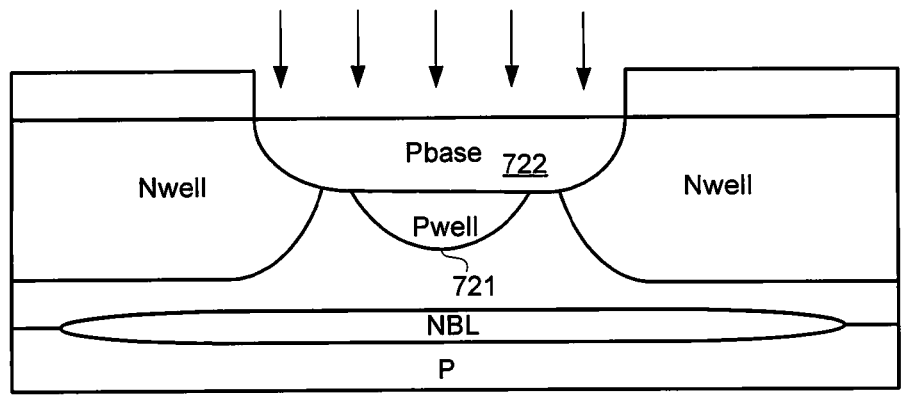

In FIG. 7D, a Pbase 722 is formed partly in Pwell 721. And Pbase 722 has a larger width and shallower depth compared to Pwell 721.

Figure 7E:
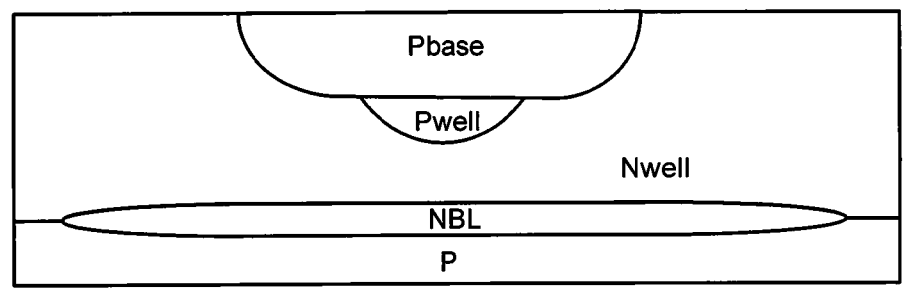

In FIG. 7E, a thermal annealing step is performed. In another embodiment, this step is performed after forming the Pwell and before forming the Pbase.

Figure 7F:
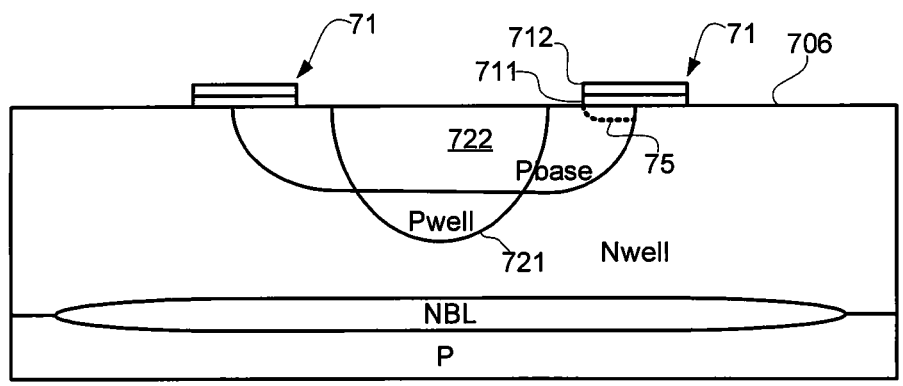

In FIG. 7F, a gate 71 is formed on top surface 706. Forming the gate 71 comprises forming an oxide layer 711 and a polysilicon layer 712. In one embodiment, the gate is formed before forming the Pbase and a thermal annealing step is further performed to side diffuse the Pbase 722 under the gate 71 and forms the channel 75. In another embodiment, the gate 71 is formed overlapped with Pbase 722 and forms the channel region 75 directly.

Figure 7G:
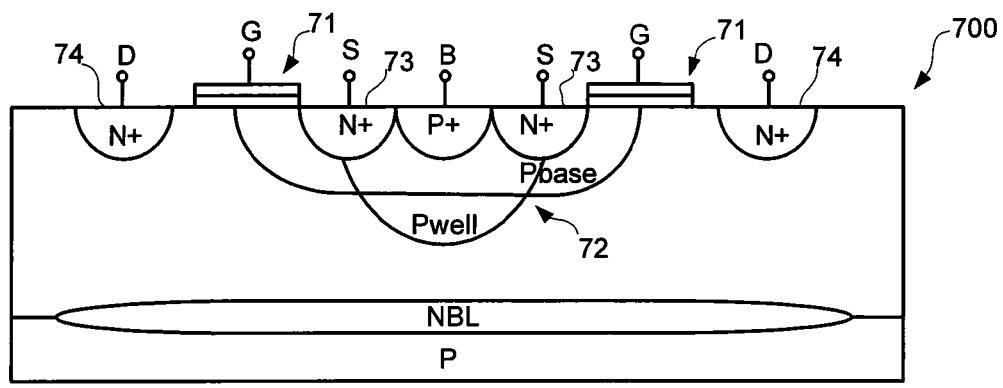

In FIG. 7G, an N+ source 73 and an N+ drain contact region 74 are formed with the same step(s). Source 73 is adjacent to body 72 at one side of gate 71 and drain contact region 74 is at another side of gate 71. Other steps are performed to finalize LDMOS device 700.

As described above, the body curvature has a negative relationship with the Pwell lateral width and the breakdown curvature has a positive relationship with the Pwell lateral width. Accordingly, since the Pwell lateral width is decided by and approximates the layout space width L7 of Nwell 703, the body curvature can be controlled by adjusting the layout space width L7 and has a negative relationship with the layout space width L7. And the breakdown voltage of LDMOS device 700 can be controlled by adjusting layout space width L7 and has a positive relationship with layout space L7.

Figure 8:
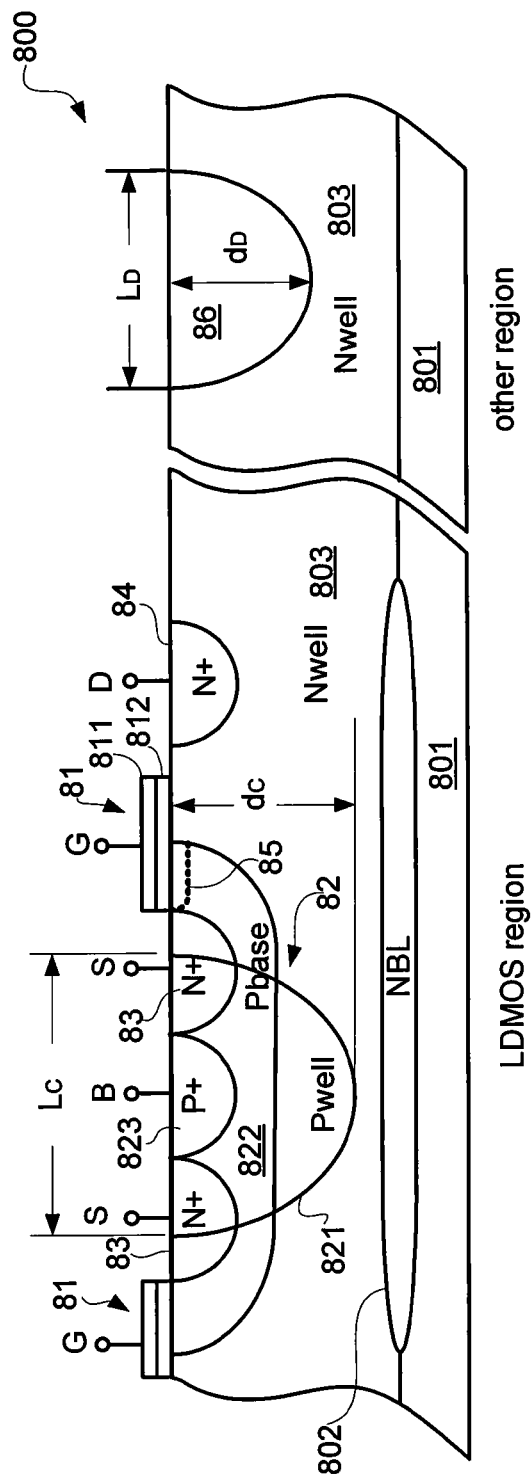
FIG. 8 shows a semiconductor device 800 comprising a LDMOS device according to an embodiment of the present invention.

FIG. 8 shows a sectional view of part of a semiconductor device 800 according to an embodiment of the present invention. The semiconductor device 800 comprises a LDMOS region where a LDMOS device is fabricated. The semiconductor device 800 further comprises other regions.

At the bottom, the semiconductor device 800 comprises a semiconductor substrate. The semiconductor substrate comprises a P-type substrate 801, an N-type buried layer 802 and an Nwell 803. In some other embodiments, the semiconductor substrate comprises other material(s). In some embodiments, the semiconductor substrate further comprises component(s), device(s) and/or system(s). In some embodiments, the semiconductor substrate comprises the P-type substrate 801 and the N-type buried layer 802.

In the LDMOS region, an N-type LDMOS device is fabricated in semiconductor substrate 80. The LDMOS device comprises a gate(s) 81 above semiconductor substrate 80, a P-type body 82 and an N-type source 83 at one side of gate 81, and an N-type drain 84 at another side of gate 81. Gate 81 comprises an insulation layer 811 such as an oxide layer and a conductive layer 812 such as a polysilicon layer. Body 82 comprises a Pwell 821 and a Pbase 822. Pwell 821 has a narrower but deeper shape than Pbase 822, thus Pbase 822 is partly in Pwell 821. Pbase 822 is side diffused under gate 81 and forms a channel 85. Body 82 is coupled to the external circuitry through a P+ body contact region 823. An N+ source 83 is formed adjacent to body 82 and gate 81, and is further self-aligned to the edge of gate 81.

The body curvature is defined by the shapes of Pwell 821 and Pbase 822. According to the second phenomenon shown in FIG. 2, the lateral width k of Pwell 821 has a positive relationship with its depth $d_C$. Accordingly, the body curvature has a positive relationship with the lateral width $L_C$ of Pwell 821 as shown in FIG. 8.

Another region of the semiconductor device 800 further comprises a Pwell 86 integrated in the semiconductor substrate. The other component(s) are not shown in the other region for briefness. In one embodiment, the Pwell 86 in the other region is also a Pwell of the body of a LDMOS device. The Pwell 86 has a lateral width $L_D$ and a depth $d_D$. The Pwell 86 in the other region and the Pwell 821 of the LDMOS device are manufactured in the same step(s) and have equivalent doping concentration. While $L_C$ is larger than $L_D$, $d_C$ is also larger than $d_D$.

In another embodiment, the other region comprise a Pwell of a lateral width of $L_E$ and a depth of $d_E$ (not shown), while the lateral width $L_C$ of the Pwell 821 is smaller than $L_E$, the depth of $d_C$ is also smaller than $d_E$.

The above embodiments relate to N-type LDMOS devices, however, P-type LDMOS devices with the opposite doping type are also in spirit of the present invention. In one embodiment, a first doping type is N doping type and a second doping type is P doping type. And in another embodiment, a first doping type is P doping type and the second doping type is N doping type. N doping type is the type that a semiconductor material is doped with either phosphor, arsenic or any other suitable material such that charge is carried by electrons, and a P doping type is the type that a semiconductor material is doped with either boron, aluminum, gallium or any other suitable material such that charge is carried by holes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

I claim:

1. A method of forming a Laterally Diffused Metal Oxide Semiconductor (LDMOS) device in a semiconductor substrate wherein the semiconductor substrate has a top surface, the method comprising:
    forming a gate above the semiconductor substrate;
    forming a body having a body curvature, comprising:
        forming a well in the semiconductor substrate from the top surface, wherein the well is of a first doping type;
        forming a base region of a first doping type from the top surface, wherein the base region is formed partly in the well, and wherein the base region is wider and shallower than the well; and
    forming a source region and a drain contact region of a second doping type, wherein the source region is adjacent to the body at one side of the gate and wherein the drain contact region is at another side of the gate;

and wherein the body curvature defined by outlines of the well and the base region is controlled by adjusting the layout width of the well; and wherein the layout width of the well is increased to increase a breakdown voltage of the LDMOS device.

2. The method of claim 1, wherein the layout width of the well is adjusted having a negative relationship with the body curvature.

3. The method of claim 1, wherein the layout width of the well is increased to decrease the body curvature.

4. The method of claim 1, further comprising forming a well of a second doping type in the semiconductor substrate, wherein said well of a second doping type is formed from the top surface, and wherein the body is formed in said well of a second doping type.

5. The method of claim 1, wherein the base region is formed self-aligned to the edge of the gate.

6. The method of claim 5, further comprising forming a channel region by performing a thermal annealing step to side diffuse the base region under the gate, and wherein the source region is formed self-aligned to the gate.

7. The method of claim 1, further comprising forming a second well of a second doping type, wherein the second well is formed using the well of the first doping type as a counterpart.

8. The method of claim 7, wherein forming the second well comprises:
forming an oxide layer self-aligned to the well of the first doping type;
forming a well of a second doping type using the oxide layer serving as a blocking mask; and
performing a thermal annealing step to side diffuse said well of a second doping type under the well of the first doping type.

9. The method of claim 1, wherein the first doping type is P type.

10. A method of forming a Lateral Diffused Metal Oxide Semiconductor (LDMOS) device in a semiconductor substrate wherein the semiconductor substrate has a top surface, the method comprising:
forming a first well of a first doping type in the semiconductor substrate from the top surface, wherein the first well is configured to have a layout space;
forming a body having a body curvature, comprising:
forming a second well of a second doping type in the semiconductor substrate from the top surface, wherein the second well is formed in the layout space of the first well;
forming a base region of a second doping type from the top surface, wherein the base region is formed partly in the second well of the second doping type, and wherein the base region is wider and shallower than the second well;
forming a gate above the semiconductor substrate; and
forming a source and a drain contact region of a first doping type, wherein the source is formed at one side of the gate and the drain contact region is formed at another side of the gate;
and wherein the body curvature defined by outlines of the second well and the base region is controlled by adjusting the layout space width of the first well; and wherein the layout space width of the first well is adjusted having a negative relationship with the body curvature.

11. The method of claim 10, wherein forming the second well further comprising:
forming an oxide layer self-aligned to the first well; and
forming the second well in the layout space using the oxide layer serving as a blocking mask.

12. The method of claim 11, further comprising performing a thermal annealing step after forming the second well.

13. The method of claim 10, further comprising forming a channel region by performing a thermal annealing step to side diffuse the base region under the gate.

14. The method of claim 10, wherein the first doping type is N type and the second doping type is P type.

15. A semiconductor device, comprising a LDMOS device integrated into a semiconductor substrate, wherein the LDMOS device comprises:
a gate above the semiconductor substrate;
a body having a body curvature, the body comprising:
a well of a first doping type having a lateral width;
a base of a first doping type, wherein the base is partly in the well, and
wherein the base is shallower than the well;
a source of a second doping type abutting the body, wherein the source is at one side of the gate and wherein the source is self-aligned to the gate; and
a drain contact region of a second doping type at another side of the gate;
wherein the body curvature has a negative relationship with the lateral width of the well.

16. The semiconductor device of claim 15, wherein the well has a first lateral width and a first depth, and wherein the semiconductor device further comprises an other region, the other region having a second well of a first doping type, and the second well having a second lateral width and a second depth, wherein the first lateral width is larger than the second lateral width, and wherein the first depth is larger than the second depth.

17. The semiconductor device of claim 15, wherein the well has a first lateral width and a first depth, and wherein the semiconductor device further comprises an other region, the other region having a second well of a first doping type, and the second well having a second lateral width and a second depth, wherein the first lateral width is smaller than the second lateral width, and wherein the first depth is smaller than the second depth.

18. The semiconductor device of claim 15, wherein the first doping type is P type.

* * * * *